Sept. 1, 1970 C. S. TURNER 3,526,769
VIDEO AMPLIFIER WITH COMPENSATION FOR UNWANTED VARIATIONS IN CARRIER MODULATION
Filed March 8, 1967
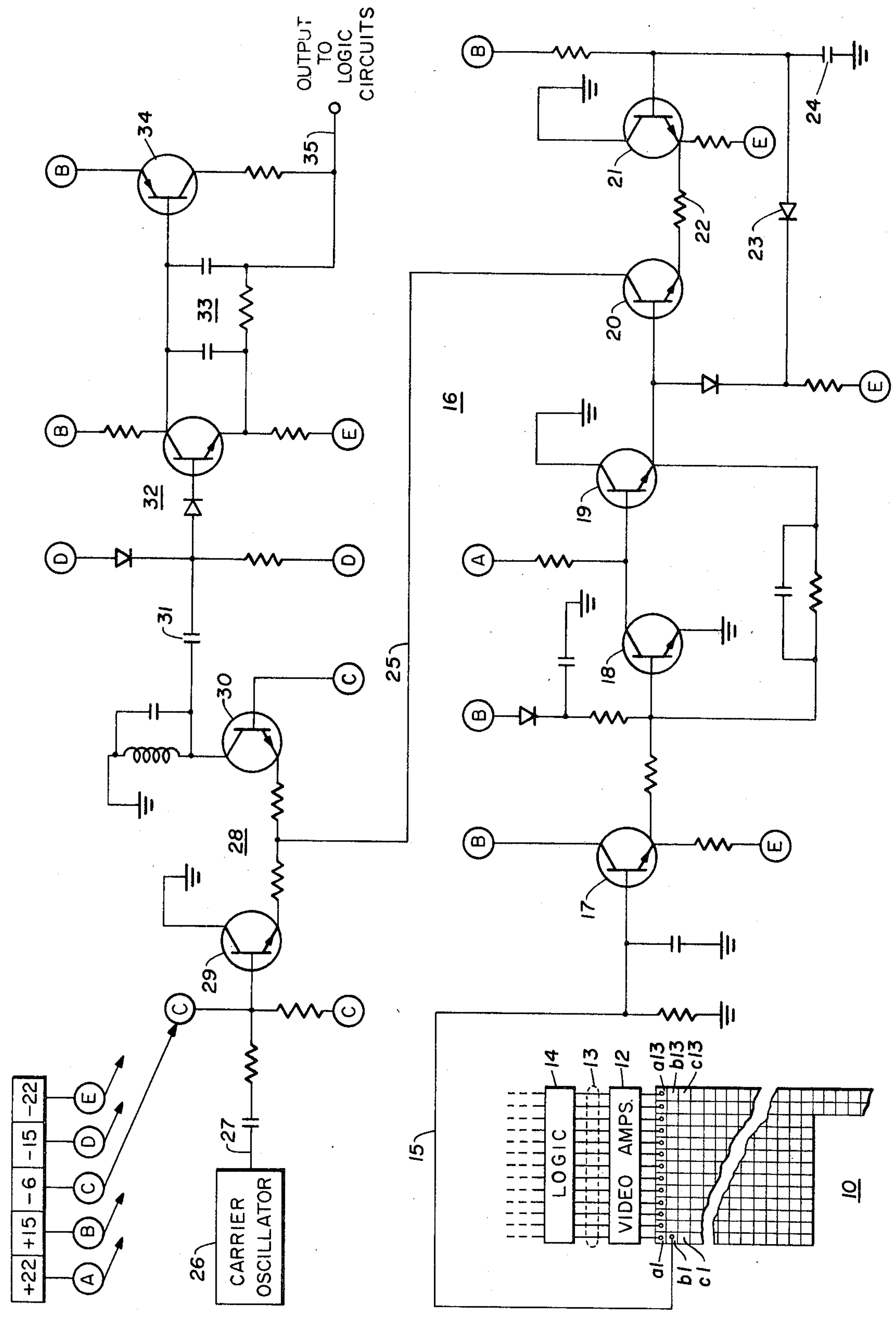

United States Patent Office 3,526,769

Patented Sept. 1, 1970

3,526,769

VIDEO AMPLIFIER WITH COMPENSATION FOR UNWANTED VARIATIONS IN CARRIER MODULATION

Charles S. Turner, Dallas, Tex., assignor to Recognition Equipment Incorporated, Dallas, Tex., a corporation of Delaware Filed Mar. 8, 1967, Ser. No. 621,652

Int. Cl. H01j *39/12*

U.S. Cl. 250—214 8 Claims

ABSTRACT OF THE DISCLOSURE

Unwanted variations in the modulation of a carrier signal are eliminated by a signal amplifier direct coupled to the carrier modulator circuit. An information signal is simultaneously applied to a current source for the signal amplifier and to the output stage of the amplifier. The current source is regulated by the information signal to eliminate any D.C. current component in the signal amplifier output which would be attributable to the information signal.

FIELD OF THE INVENTION

This invention relates to a video amplifier employing an amplitude-modulated differential amplifier. In a more specific aspect, the invention relates to a system for eliminating unwanted variations in the modulation of a carrier signal by such differential amplifier where a direct current voltage level of an information signal is to be used as the modulating signal.

THE PRIOR ART

In optical character recognition, a multicell retina has heretofore been employed together with a suitable logic system to identify a character or image projected onto the retina.

Prior to acceptance by the logic system, the retina output signals are amplified and conditioned by modulating a carrier signal in proportion to the respective outputs of the cells in the retina and amplifying the modulated carrier signals and demodulating the same.

In transistorized circuits, each retina output signal may be applied to an amplitude-modulated differential amplifier stage either as a base signal, an emitter signal, or a collector signal. The carrier signal is injected into such stage as base signal. Base and emitter modulation are very similar in that the gain of the carrier amplifier stage is controlled by the emitter current. In collector modulation, the gain of the carrier amplifier stage is controlled by the emitter-to-collector voltage.

In the emitter modulation configuration, the retina output signal may be amplified by a suitable amplifier stage and then directly coupled to the emitters of the differential amplifier stage. The emitter current of such differential amplifier will have a direct current component which is dependent upon direct current bias conditions. Such conditions will be sensitive to the reference level or direct current level of the retina output signal.

A reference level of the signal from the individual retina photocells, when a black image is projected onto the retina, will vary from photocell to photocell due to individual photocell characteristics. Such variations, if not compensated, would create variations in the differential amplifier bias conditions associated with each retina output channel and thereby produce variations in gain among the differential amplifiers.

In order to enhance the reliability in any decision as to character identifications, it is desirable to eliminate the effect of such gain variations in the differential amplifiers when the same black or reference image is projected onto each photocell of the retina.

SUMMARY

In accordance with the present invention, a carrier signal is injected into the base of one of a pair of transistors of an amplitude-modulated differential amplifier. A photocell output signal is applied to the input of a photocell amplifier. The collector of the output transistor of the photocell amplifier is directly coupled to the junction of the emitters of the pair of transistors in the differential amplifier so as to operate as the current source for the differential amplifier in an emitter modulation configuration. The emitter of the photocell amplifier is coupled to a regulator which develops a voltage to maintain the gain of the modulator at a maximum when the photocell signal is maximum in a positive direction and at a minimum when the information signal is maximum in a negative direction with a suitable time constant means for the control circuit.

THE DRAWINGS

For a more complete understanding of the present invention and for further objects and advantages thereof, reference may now be had to the following description taken in conjunction with the accompanying drawing which is a diagram illustrating a portion of an optical character recognition system embodying the present invention.

THE PREFERRED EMBODIMENTS

A video amplifier, as embodied in the present invention, is particularly adaptable for use in an optical character recognition system of the type illustrated in FIG. 1, wherein the images of successive characters are projected from printed material onto a retina 10 made up of a two-dimensional array of photocells. Each photocell permits current flow therethrough from a source (not shown) which is dependent upon the amount of light thereon.

A bank of video amplifiers 12 is connected to the output of the retina. One such amplifier is provided for each photocell. Output channels 13 from the bank of video amplifiers 12 extend to logic circuits 14. Such logic circuits may be of any configuration suitable for the identification and utilization of a character or image projected onto the retina.

Only a portion of the retina 10 has been illustrated connected to the bank of video amplifiers 12, i.e., only the photocells in the top row of the retina 10. Each of the photocells in all other rows similarly are connected to video amplifiers (not shown) but which preferably will be of the form connected to channel 15 leading to the input of a video amplifier 16.

The video amplifier 16 is provided with a second input channel 27 to which a high frequency carrier signal is applied from an oscillator 26. Amplifier 16 gain is controlled to provide an output signal on channel 35 which will be of analog character and will vary from a minimum voltage to a maximum voltage when the photocell *b1* changes from registration with a black image to registration with a background area.

The signal from photocell *b1* is applied by way of channel 15 to the base of a transistor 17. Transistors 17, 18, 19, and 20 comprise a signal amplifier in which the transistor 20 is an output transistor. The signal amplifier serves to amplify the signal from photocell *b1* to supply a modulation signal on the line 25 leading to differential amplifier 28.

A carrier signal from carrier oscillator 26 is applied to the base of the input transistor 29 of the differential amplifier 28 which is controlled by the modulation signal on line 25 connected to a modulator input terminal between the emitter electrode of transistors 29 and 30. The signal modulated carrier is then applied by way of condenser 31 to a detector section 32. The output from the detector 32 is applied to a filter section 33 which drives an output transistor 34. The output channel 35 is connected to the collector of output transistor 34.

The gain of the differential amplifier 28 is directly proportional to the current through output transistor 20. Transistor 20 operates as a current source to the emitters of transistors 29 and 30 and this current is controlled by the information signal at the base of transistor 20. This current in turn controls the gain of modulator transistor 30 by controlling the current sensitive parameters of transistors 29 and 30, namely the input impedances and the Beta of these transistors. Current from transistor 20 also has a D.C. component dependent upon D.C. bias conditions. These D.C. bias conditions are sensitive to the D.C. input level of the information signal on the base of transistor 20.

Individual photocells employed in the retina may have dark current levels which are not uniform due to the characteristics of each photocell. That is, when a black image is projected onto several photocells, the photocell output currents may differ substantially. Amplification of such photocell output currents by transistors 17, 18, and 19 of the corresponding video amplifiers will present information signals to the bases of transistor 20 of such amplifiers which will be in direct proportion to such variable photocell outputs.

Such dark current information signals establish the reference or D.C. bias conditions of transistor 20. In order to eliminate variations in this D.C. current component of transistor 20 and thereby allow the gain of differential amplifier 28 to be controlled by only the information signal input to transistor 20, compensation transistor 21 and its associated circuit are utilized to compensate for the D.C. current variations. Under steady state conditions, the voltages on the bases of transistors 20 and 21 are identical. When there is zero voltage across resistor 22, no emitter current flows in transistor 20. As a result, no current flows in transistors 29 or 30 and modulator transistor 30 has a gain of zero.

When an information signal is present, the voltage on the base of transistor 20 will be representative of this signal. At the same time, the circuit of transistor 21 operates to hold the voltage on the base of compensation transistor 21 at the negative-most value of the signal on the base of transistor 20. More particularly, diode 23 and capacitor 24 form a halfwave rectifier. Capacitor 24 becomes charged as the signal on the base of transistor 20 becomes more negative. When the signal on the base of transistor 20 becomes more positive, as with an information input signal, diode 23 is biased off and capacitor 24 holds its more negative charge, thereby holding the base of transistor 21 at this more negative value.

The voltage across resistor 22 at any given time is representative of the difference between the information signal on the base of transistor 20 and the negative-most value of said information signal. Current in transistor 20 regulates the gain of modulator transistor 30 so that such gain is a maximum when the information signal is a maximum in a positive direction and is zero when the information signal is a maximum in a negative direction. Upon removal of an information signal from the base of transistor 20, the voltage across capacitor 24 will be restored to its steady state value.

Video amplifier control of the foregoing character has been found to be highly significant in character recognition. The level of each video amplifier output signal is thereby controlled so as to be an analog value variable from the same reference level for all video amplifiers and directly proportional to the shade of gray or black representing the character image area in registration with each photocell.

Having described the invention in connection with the foregoing embodiment thereof, it is to be understood that further modifications may now suggest themselves to those skilled in the art and it is intended to cover such modifications as fall within the scope of the appended claims.

What is claimed is:

1. In an optical character recognition system where photocells produce signals dependent upon registration with successive objects of varying shading, the combination therewith which comprises:

(a) a transistorized signal amplifier directly coupled to said photocell and having an output transistor, (b) a carrier-excited modulator channel having a modulator input terminal, (c) means for coupling the collector of said output transistor and said modulator input terminal, (d) a compensation transistor coupled by an impedance means from its emitter to the emitter of said output transistor and connected at its base by way of rectifying means to the base of said output transistor, (e) a capacitor coupling the base of said compensation transistor to ground, (f) a ground connection leading to the collector of said compensation transistor, and (g) supply circuit means connected to the base of said compensation transistor, said capacitor, and the rectifying means for controlling the gain of said output transistor to be at a maximum when the signal from said photocell is a positive maximum and to be at zero gain when the photocell signal is a negative maximum.

2. The method of compensating a video amplifier wherein an information signal is amplified and applied from an output stage to a modulator input terminal of a modulator which comprises:

(a) generating a voltage representative at a given instant of the difference between said information signal and the negative-most value of said information signal attained during a predetermined time interval preceding said instant, and (b) controlling the gain of said output stage in dependence upon said voltage.

3. The combination set forth in claim 1 in which the coupling between said emitters is a resistor.

4. The combination set forth in claim 1 in which said rectifier means includes a first rectifier connected between the base of said output transistor and a negative supply terminal and a second rectifier connected in series with and poled opposite said first rectifier between the bases of said output transistor and said compensation transistor.

5. The combination set forth in claim 4 wherein said first rectifier means is poled for division of flow of signal current between the base of said output transistor and said negative supply terminal and said second rectifier means is poled for division of current flow from said supply circuit between the base of said compensation transistor and said negative supply terminal.

6. In a video amplifier having a carrier channel modulated by the output of a signal amplifier in which there is direct coupling between the output stage of such signal amplifier and the modulator of such carrier channel, the combination comprising:

(a) means for compensating for variations in D.C. current in the output stage of the signal amplifier, (b) means for applying an information signal simultaneously to such compensating means and the input of the output stage of such signal amplifier, and (c) means for holding said compensating means at a level to eliminate any D.C. current component in the signal amplifier output imposed upon the signal amplifier output stage by the information signal.

7. In an optical character recognition system where photocells produce signals dependent upon registration with successive objects of varying shading, the combination comprising:

(a) a signal amplifier directly coupled to a photocell and including an output stage having an input terminal, (b) a carrier excited modulator channel having a modulator input terminal directly coupled to the output stage of said signal amplifier, (c) compensating means including an impedance coupled to said output stage and rectifiying means connected to the input of said output stage, and (d) a capacitor coupling said compensating means to ground and connected to said rectifying means, said capacitor being charged to the negative maximum of the photocell signal to hold said compensating means at a level to eliminate any D.C. current components, in the signal amplifier output imposed upon the signal amplifier output stage by the photocell signal.

8. The combination as set forth in claim 7 wherein said rectifier means includes a first diode connected between the input of said output stage and a negative supply terminal and a second rectifier connected in series with and poled opposite said first rectifier between the input of said output stage and said compensating means.

References Cited

UNITED STATES PATENTS 3,321,629 5/1967 Hobrough ---------- 250—207

ARCHIE R. BORCHELT, Primary Examiner

M. ABRAMSON, Assistant Examiner

U.S. Cl. X.R.

250—207